United States Patent
Furuya (10) Patent No.: US 8,864,932 B2
(45) Date of Patent: Oct. 21, 2014

(54) PLASMA PROCESSING APPARATUS, ELECTRODE TEMPERATURE ADJUSTMENT DEVICE AND ELECTRODE TEMPERATURE ADJUSTMENT METHOD

(75) Inventor: Masao Furuya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1224 days.

(21) Appl. No.: 12/115,115

(22) Filed: May 5, 2008

(65) Prior Publication Data

US 2009/0044752 A1 Feb. 19, 2009

Related U.S. Application Data

(60) Provisional application No. 60/970,550, filed on Sep. 7, 2007.

(30) Foreign Application Priority Data

Jun. 5, 2007 (JP) .................................. 2007-149585

(51) Int. Cl.
- *H01L 21/306* (2006.01)
- *C23F 1/00* (2006.01)
- *H01J 37/32* (2006.01)
- *C23C 16/455* (2006.01)
- *G05D 23/19* (2006.01)

(52) U.S. Cl.
CPC ..... *H01J 37/32165* (2013.01); *H01J 21/67248* (2013.01); *H01J 37/32724* (2013.01); *C23C 16/45572* (2013.01); *H01J 37/32091* (2013.01); *G05D 23/19* (2013.01)
USPC ............. 156/345.27; 156/345.34; 156/345.43

(58) Field of Classification Search
USPC ............................ 156/345.27, 345.34, 345.43
See application file for complete search history.

(56) References Cited

U.S. PATENT DOCUMENTS

| | | | |
|---|---|---|---|
| 2001/0042594 A1* | 11/2001 | Shamouilian et al. | 156/345 |
| 2003/0049376 A1* | 3/2003 | Schwarm et al. | 427/255.28 |
| 2005/0000442 A1 | 1/2005 | Hayashi et al. | |
| 2006/0037701 A1* | 2/2006 | Koshiishi et al. | 156/345.44 |
| 2006/0213763 A1* | 9/2006 | Furuya et al. | 204/192.1 |

FOREIGN PATENT DOCUMENTS

| | | |
|---|---|---|
| JP | 2004-342704 | 12/2004 |
| JP | 2006-269944 | 10/2006 |
| JP | 2006-270017 | 10/2006 |

* cited by examiner

*Primary Examiner* — Rakesh Dhingra
(74) *Attorney, Agent, or Firm* — Oblon, Spivak, McClelland, Maier & Neustadt, L.L.P.

(57) ABSTRACT

Before a substrate is processed in a plasma processing apparatus that inhibits an increase in the temperature of an upper electrode attributable to DC voltage application as well as an increase in the upper electrode temperature attributable to high-frequency power application, a heating medium target temperature to be achieved by a heating medium in order to adjust the upper electrode temperature to a predetermined temperature setting is calculated based upon the levels of the high-frequency power to be applied to the upper electrode and a susceptor (lower electrode) and the DC voltage to be applied to the upper electrode. During the substrate processing, the heating medium, the temperature of which is controlled based upon the target temperature, circulates through a flow passage formed at the upper electrode so as to control the temperature of the upper electrode.

11 Claims, 7 Drawing Sheets

PLASMA PROCESSING APPARATUS, ELECTRODE TEMPERATURE ADJUSTMENT DEVICE AND ELECTRODE TEMPERATURE ADJUSTMENT METHOD

CROSS-REFERENCE TO RELATED APPLICATIONS

This document claims priority to Japanese Patent Application Number 2007-149585, filed on Jun. 5, 2007 and U.S. Provisional Application No. 60/970,550, filed on Sep. 7, 2007, the entire content of which are hereby incorporated by reference.

FIELD OF THE INVENTION

The present invention relates to a plasma processing apparatus, an electrode temperature adjustment device and an electrode temperature adjustment method.

BACKGROUND OF THE INVENTION

During production of semiconductor devices, liquid crystal display devices or the like, a plasma processing apparatus that executes a specific type of processing such as etching or film formation on a substrate, e.g., a semiconductor wafer or a glass substrate for use in liquid crystal display devices, or the like, by applying thereto plasma generated inside a processing chamber, the internal pressure of which has been lowered to a predetermined level, is utilized.

While there are various types of plasma processing apparatuses known in the related art, most of them are plane-parallel plasma processing apparatuses having a susceptor (lower electrode) also used as a stage on which the substrate is placed, disposed toward the bottom inside the processing chamber, and an upper electrode also used as a processing gas delivery unit, disposed toward the top inside the processing chamber, so as to face opposite the susceptor.

In such a plane-parallel plasma processing apparatus, a specific type of processing gas is delivered into the processing chamber while the processing chamber is evacuated, so as to create a processing gas atmosphere achieving a predetermined degree of vacuum inside the processing chamber. In this state, high-frequency power with individually selected specific frequencies is supplied to the susceptor and the upper electrode, thereby generating plasma with the processing gas in the space between the substrate and the upper electrode. The substrate is processed, e.g. etched, as the plasma thus generated is applied to the substrate.

The upper electrode in this type of plasma processing apparatus is disposed at a position at which it is directly exposed to the plasma. In addition, a significant quantity of heat is generated at the upper electrode to which the high-frequency power with a high-level output for purposes of plasma generation is applied. Thus, the temperature of the upper electrode is likely to rise to an undesirably high level as the high-frequency power is applied thereto. Furthermore, the upper electrode with a greater thermal capacity compared to the lower electrode does not assure as good a response to temperature adjustment as the lower electrode. Consequently, it is not easy to sustain the temperature of the upper electrode at the desired temperature setting with a high level of accuracy.

The technologies developed for the upper electrode temperature adjustment in the known art include the one whereby the upper electrode is cooled by forming inside the upper electrode a flow passage through which a heating medium, such as a coolant or brine with the temperature thereof adjusted to a predetermined level, is to flow and distributing the heating medium through this flow passage (see, for instance, Japanese Laid Open Patent Publication No. 2004-342704(Patent Reference Literature 1) and Japanese Laid Open Patent Publication No. 2006-269944(Patent Reference Literature 2)).

In the plane-parallel plasma processing apparatus described above, a predetermined level of DC current may be superimposed over the high-frequency power and thus applied to the upper electrode together with the high-frequency power in order to achieve precision control of the potential of the plasma generated inside the processing chamber, the plasma density uniformity within the plane of the substrate and the like during the substrate processing (see, for instance, Japanese Laid Open Patent Publication No. 2006-270017(Patent Reference Literature 3)).

Tests and the like conducted by the inventor of the present invention et al. have revealed that such an application of a DC voltage to the upper electrode, too, causes an undesirable increase in the temperature of the upper electrode accompanied by a significant adverse effect on the characteristics (e.g., the etching rate, the device shape and the like) of the elements being formed on the substrate.

Since the upper electrode temperature control methods in the related art, such as those disclosed in patent reference literatures 1 and 2, do not take into consideration the heat transferred into the upper electrode as a DC voltage is applied to the upper electrode, the undesirable rise in the temperature of the upper electrode cannot be sufficiently prevented by directly adopting the temperature control technologies in a plasma processing apparatus in which a DC voltage is applied to the upper electrode.

SUMMARY OF THE INVENTION

Accordingly, an object of the present invention, having been completed by addressing the issues discussed above, is to provide a plasma processing apparatus and the like, with which the rise in the electrode temperature attributable to the high-frequency power application is effectively inhibited and also the rise in the electrode temperature attributable to the DC voltage application is inhibited to a sufficient extent as a DC voltage superimposed over high-frequency power is applied to an electrode together with the high-frequency power.

The object described above is achieved in an aspect of the present invention by providing a plasma processing apparatus comprising an evacuatable processing chamber in which a processing target substrate is placed, a first electrode (e.g., an upper electrode) disposed inside the processing chamber, a second electrode (e.g., a lower electrode) disposed to face opposite the first electrode and supports the substrate, a first high-frequency power source that applies first high-frequency power to the first electrode, a second high-frequency power source that applies second high-frequency power with a lower frequency than the first high-frequency power to the second electrode, a DC power source that applies a DC voltage to the first electrode, a processing gas supply means for supplying a specific processing gas into the processing chamber, a temperature adjustment device that adjusts the temperature of the first electrode by circulating a heating medium with the temperature thereof adjusted to a predetermined level through a circulating passage formed in the first electrode and a control unit that executes control of temperature adjustment for the heating medium when processing the substrate based upon a target temperature to be achieved by the heating medium to adjust the temperature of the first electrode to a predetermined temperature setting, calculated based upon, at least, the levels of the high-frequency power to be applied to the individual electrodes and the DC voltage to be applied to the first electrode.

According to the present invention, based upon the findings obtained through the tests and the like conducted by the inventor of the present invention et al. that an undesirable increase in the temperature of the first electrode is caused not only by the high-frequency power applied to the first electrode but also by a DC voltage superimposed over the high-frequency power and applied to the first electrode together with the high-frequency power, the temperature of the first electrode is adjusted so as to achieve the preset temperature by factoring in the DC voltage as well. More specifically, before executing the substrate processing, the target temperature that must be achieved by the heating medium in order to adjust the temperature of the first electrode to the specific temperature setting is calculated based upon, at least, the levels of the high-frequency power to be applied to the individual electrodes and the DC voltage to be applied to the first electrode. As a result, the increase in the first electrode temperature attributable to the high-frequency power application is inhibited and, at the same time, the increase in the first electrode temperature attributable to the application of the DC voltage is inhibited to a sufficient extent, as well, which allows the temperature of the first electrode to be accurately maintained at the preset temperature during the substrate processing.

In addition, it is desirable that the heating medium target temperature be calculated based upon a predetermined arithmetic operation expression for determining the temperature difference between the predetermined temperature setting for the first electrode and the heating medium target temperature, that the arithmetic operation expression include a first high-frequency power-based term, a second high-frequency power-based term and a DC voltage-based term and that the DC voltage-based term is constituted with a multiplicative term having the DC voltage multiplied by the second high-frequency power. The heating medium target temperature can be calculated accurately based upon such an arithmetic operation expression. It has also been learned based upon the results of the tests and the like conducted by the inventor of the present invention et al. that the level of the second high-frequency power applied to the second electrode also plays a role in the increase in the temperature of the first electrode attributable to the DC voltage application. For instance, when the second high-frequency power is raised to a higher level in conjunction with a given DC voltage, a greater DC current flows through the first electrode. This, in turn, increases the quantity of heat entering the first electrode, to result in an increase in the temperature of the first electrode. This factor is reflected in the arithmetic operation expression by constituting the DC voltage-based term with a multiplicative term in which the DC voltage is multiplied by the second high-frequency power. As a result, the undesirable increase in the temperature of the first electrode can be more rigorously controlled.

With $\Delta T$ representing the temperature difference between the predetermined temperature setting for the first electrode and the heating medium target temperature, the arithmetic operation expression may be written as; $\Delta T = k(a \cdot A + b \cdot B + c \cdot HV \cdot B) \cdot D/C$ (k: a power-to-temperature conversion coefficient, A: the first high-frequency power, B: the second high-frequency power, HV: the DC voltage, C: the length of processing time per substrate, D: the length of time over which the high-frequency power is applied during the processing time C, a: a coefficient for the term A, b: a coefficient for the term B, c: a coefficient for the term $HV \cdot B$). By factoring in the length of time over which the high-frequency power is applied and the like when determining the heating medium target temperature as described above, the temperature of the first electrode can be controlled with an even higher level of accuracy.

It is desirable that the coefficient c in the arithmetic operation expression be adjusted to an optimal value in correspondence to the level of the second high-frequency power. For instance, when processing a plurality of substrates in succession, the temperature at the first electrode during the processing of the first substrate may be lower than the temperature at the first electrode during the processing on second and subsequent substrates, depending upon the level of the second high-frequency power. Under such circumstances, the extent to which the temperature at the first electrode is lowered during the processing on the initial substrate can be minimized by adjusting the coefficient c. Through these measures, the temperature of the first electrode can be sustained at the specific temperature setting with a high level of accuracy through the entire processing, from the first substrate through the last substrate, assuring consistency with regard to the processing results for the individual substrates.

The temperature adjustment device may include, for instance, a circulating passage passing through the first electrode, through which the heating medium is circulated at the first electrode, a first heat exchanger that executes heat exchange for the heating medium having passed through the electrode by using the sensible heat of a liquid coolant in the circulating passage, a second heat exchanger that executes heat exchange for the heating medium having passed through the first heat exchanger by using the latent heat of a coolant in the circulating passage and a heater that heats the heating medium, which is to be supplied into the electrode, in the circulating passage. The temperature adjustment device structured as described above is able to rapidly cool the heating medium to the target temperature via the first heat exchanger and the second heat exchanger and is also capable of adjusting the temperature of the heating medium to the desired level by heating the heating medium via the heater.

The object described above is also achieved in another aspect of the present invention by providing an electrode temperature adjustment device that adjust the temperature of a first electrode in a plasma processing apparatus that includes the first electrode and a second electrode disposed inside a processing chamber so as to face opposite each other and executes a specific type of processing on a substrate placed on the second electrode by applying first high-frequency power and a DC voltage to the first electrode and applying second high-frequency power with a frequency lower than the first high-frequency power to the second electrode. The electrode temperature adjustment device comprises a circulating passage passing through the first electrode, through which a heating medium is circulated at the first electrode, a heating medium temperature adjuster that adjusts the temperature of the heating medium and a control unit that executes control for temperature adjustment for the heating medium when processing the substrate based upon a target temperature to be achieved by the heating medium to adjust the temperature of the first electrode to a predetermined temperature, calculated before processing the substrate based upon, at least, the levels of the high-frequency power to be applied to the individual electrodes and the DC voltage to be applied to the first electrode. With the electrode temperature adjustment device described above, the temperature of the first electrode can be sustained at the selected temperature setting with a high level of accuracy when processing the substrate by inhibiting the increase in the first electrode temperature attributable to the high-frequency power application and also inhibiting to a sufficient extent the increase in the first electrode temperature attributable to the DC voltage application.

In addition, it is desirable that the heating medium target temperature be calculated based upon a predetermined arithmetic operation expression for determining the temperature difference between the predetermined temperature setting for the first electrode and the heating medium target temperature. With $\Delta T$ representing the temperature difference between the predetermined temperature setting for the first electrode and the heating medium target temperature, the arithmetic operation expression may be written as; $\Delta T = k(a \cdot A + b \cdot B + c \cdot HV \cdot B) \cdot D/C$ (k: a power-to-temperature conversion coefficient, A: the first high-frequency power, B: the second high-frequency power, HV: the DC voltage, C: the length of processing time per substrate, D: the length of time over which the high-frequency power is applied during the processing time C, a: a coefficient for term A, b: a coefficient for term B, c: a coefficient for term HV·B).

The object described above is further achieved in yet another aspect of the present invention by providing an electrode temperature adjustment method for adjusting the temperature of a first electrode in a plasma processing apparatus that includes the first electrode and a second electrode disposed inside a processing chamber so as to face opposite each other and executes a specific type of processing on a substrate placed on the second electrode by applying first high-frequency power and a DC voltage to the first electrode and applying second high-frequency power with a frequency lower than the first high-frequency power to the second electrode. The electrode temperature adjustment method comprises a step executed before processing the substrate, in which a target temperature that must be achieved by a heating medium to adjust the temperature of the first electrode to a predetermined temperature setting is calculated based upon, at least, the levels of the high-frequency power to be applied to the individual electrodes and the DC voltage to be applied to the first electrode and a step executed when processing the substrate, in which control is executed to hold the temperature of the first electrode at the predetermined temperature setting by circulating the heating medium the temperature of which is adjusted based upon the target temperature through a circulating passage formed inside the first electrode. Through the electrode temperature adjustment method described above, the temperature of the first electrode can be sustained at the selected temperature setting with a high level of accuracy when processing the substrate by inhibiting the increase in the first electrode temperature attributable to the high-frequency power application and also inhibiting the increase in the first electrode temperature attributable to the DC voltage application to a sufficient extent.

In addition, it is desirable that the heating medium target temperature be calculated based upon a predetermined arithmetic operation expression for determining the temperature difference between the predetermined temperature setting for the first electrode and the heating medium target temperature. With $\Delta T$ representing the temperature difference between the predetermined temperature setting for the first electrode and the heating medium target temperature, the arithmetic operation expression may be written as; $\Delta T = k(a \cdot A + b \cdot B + c \cdot HV \cdot B) \cdot D/C$ (k: a power-to-temperature conversion coefficient, A: the first high-frequency power, B: the second high-frequency power, HV: the DC voltage, C: the length of processing time per substrate, D: the length of time over which the high-frequency power is applied during the processing time C, a: a coefficient for term A, b: a coefficient for term B, c: a coefficient for term HV·B).

It is desirable that in the step of calculating the target temperature for the heating medium, the heating medium target temperature be determined based upon $\Delta T$ calculated as expressed in the arithmetic operation expression by reading out the first high-frequency power, the second high-frequency power, the DC voltage, the length of processing time per substrate, the length of time over which the high-frequency power is applied during the processing time and the coefficients for the individual terms, all stored in advance as processing conditions in a storage medium. Since $\Delta T$ is calculated based upon the arithmetic operation expression by using known values, i.e., the processing conditions stored in advance in a storage medium, the heating medium target temperature can be determined through the step described above before actually processing the substrate. It is to be noted that the description in the specification is provided by assuming that 1 mTorr=$(10^{-3} \times 101325/760)$ Pa.

According to the present invention, when a DC voltage is superimposed upon high-frequency power applied to an electrode so as to apply the DC voltage to the electrode as well as the high-frequency power, the increase in the electrode temperature attributable to the high-frequency power application can be inhibited and also, the increase in the electrode temperature attributable to the DC voltage application can be inhibited to a sufficient extent.

BRIEF DESCRIPTION OF THE DRAWINGS

FIG. 7 presents the results of tests conducted by executing upper electrode temperature control based upon the temperature difference $\Delta T$ calculated with the DC voltage factored in.

DETAILED DESCRIPTION OF THE PREFERRED EMBODIMENT

The following is a detailed explanation of a preferred embodiment of the present invention, given in reference to the attached drawings. It is to be noted that in the specification and the drawings, the same reference numerals are assigned to components having substantially identical functions and structural features, so as to eliminate the need for a repeated explanation thereof.

(Plasma Processing Apparatus)

Figure 1:
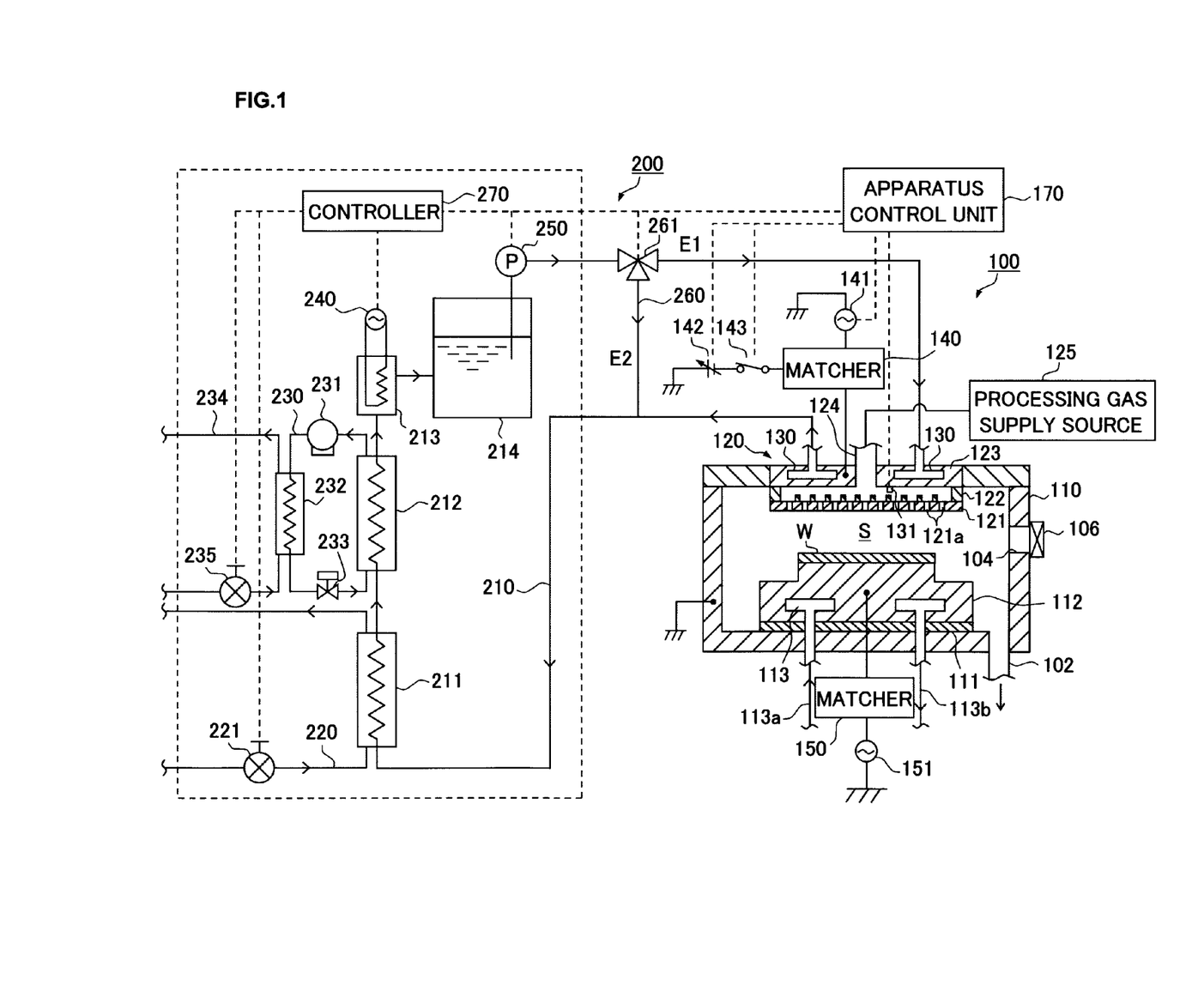
FIG. 1 schematically illustrates the structures of the electrode temperature adjustment device achieved in an embodiment of the present invention and a plasma processing apparatus that may include this electrode temperature adjustment device.

A structural example that may be adopted in a plasma processing apparatus equipped with the electrode temperature adjustment device achieved in the embodiment of the present invention is first described in reference to the drawings. FIG. 1 illustrates the structure adopted in the plasma processing apparatus in the embodiment. The plasma processing apparatus in this example is a capacitance-coupled plasma etching apparatus assuming a plane parallel electrode configuration.

As shown in FIG. 1, the plasma processing apparatus 100 includes a processing chamber (chamber) 110 constituted with a substantially cylindrical processing container. The processing chamber 110 may be constituted of, for instance, an aluminum alloy, with the inner wall surface thereof coated with, for instance, an alumina film or an yttrium oxide film. The processing chamber 110 is grounded.

Inside the processing chamber 110, a susceptor 112, to function as a second electrode, is disposed at the bottom via an insulating plate 111. The susceptor 112, which may be formed by using, for instance, an aluminum alloy, functions as a lower electrode in the plane parallel electrode structure. In addition, the susceptor 112, substantially assuming the shape of a circular column also functions as a stage on the upper surface of which a substrate such as a semiconductor wafer (hereafter may simply be referred to as a "wafer") W is placed. An electrostatic chuck (not shown) may be disposed at the top of the susceptor 112 so as to clamp the wafer W to the susceptor 112. A gas supply line, through which a heat transfer gas (such as He gas) originating from a heat transfer gas mechanism (not shown) is supplied to the space between the electrostatic charge and the wafer W, is disposed at the susceptor 112.

A coolant chamber 113, which may be formed in, for instance, a ring-shape, is present inside the susceptor 112. The coolant chamber 113 communicates via pipings 113a and 113b with a chiller unit (not shown) installed outside the processing chamber 110. A coolant supplied through the pipings 113a and 113b circulates at the coolant chamber 113 and as the supplied coolant thus circulates, the temperature of the wafer W placed on the susceptor 112 is controlled.

An upper electrode 120 used as a first electrode for purposes of plasma generation is disposed parallel to and facing opposite the susceptor 112, above the susceptor 112 functioning as the lower electrode. The space between the upper electrode 120 and the susceptor 112, i.e., the lower electrode, is a plasma generation space S.

The upper electrode 120 assumes a three-layer structure constituted with, for instance, an electrode plate 121, a dispersing plate 122 and a top plate 123. A gas supply pipe 124 through which the processing gas is delivered into the processing chamber 110 is connected to the center of the uppermost plate, i.e., the top plate 123. The gas supply pipe 124 is connected to a processing gas supply source 125, constituting a processing gas supply means. Although not shown, a mass flow controller, a switching valve and the like, via which the flow rate of the processing gas supplied into the processing chamber is adjusted, are disposed in the gas supply pipe 124. A fluorocarbon gas ($C_xF_y$) such as $C_4F_8$, to be used as the processing gas in etching processes, is supplied from the processing gas supply source 125.

The dispersing plate 122, assuming a substantially cylindrical shape, is disposed under the top plate 123 and the processing gas delivered through the gas supply pipe 124 can be evenly dispersed via the dispersing plate. The electrode plate 121, which faces opposite the wafer W on the susceptor 112, is disposed under the dispersing plate 122. Numerous gas outlet holes 121a are formed at the electrode plate 121 and the processing gas, having been dispersed via the dispersing plate 122, can thus be injected evenly toward the plasma generation space S through the plurality of gas outlet holes 121a. In this sense, the upper electrode 120 functions as a showerhead through which the processing gas is supplied.

A ring-shaped flow passage 130, through which a heating medium (e.g., brine) travels, is formed, for instance, inside the top plate 123 at the upper electrode 120. The flow passage 130 constitutes part of a circulating passage 210 of a temperature adjustment device 200 to be detailed later. In addition, a temperature sensor 131 that measures the temperature of the upper electrode 120 under temperature control is disposed, for instance, inside the dispersing plate 122.

A first high-frequency power source 141 is electrically connected to the upper electrode 120 via a matcher 140 designated as a first matcher. From the first high-frequency power source 141, high-frequency power with a frequency thereof set equal to or higher than 10 MHz, e.g., 60 MHz, is output. The matcher 140, which matches the load impedance with the internal (or output) impedance of the first high-frequency power source 141, functions so as to match the impedance output from the first high-frequency power source 141 with the load impedance in appearance, as plasma is generated inside the processing chamber 110. As the high-frequency power is applied to the upper electrode 120 from the first high-frequency power source 141, plasma is generated from the processing gas in the plasma generation space S within the processing chamber 110.

In addition to the first high-frequency power source 141 described above, a variable DC power source 142 is electrically connected to the upper electrode 120. Such a variable DC power source 142 may be a bipolar power source. More specifically, the variable DC power source 142 is connected to the upper electrode 120 via the matcher 140 and the DC voltage power supply can be turned on or off via a switch 143 disposed between the variable DC power source 142 and the matcher 140. It is to be noted that the polarity of the variable DC power source 142, the electrical current·voltage originating from the variable DC power source 142 and the ON/OFF state of the switch 143 are controlled by an apparatus control unit 170.

Figure 2:
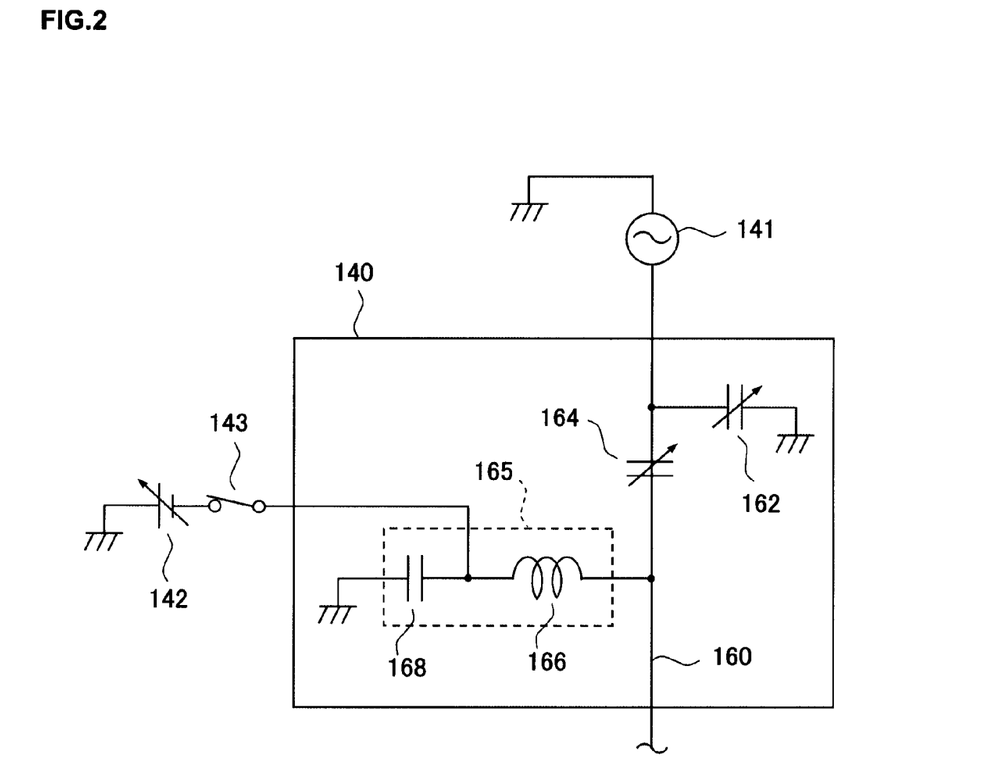
FIG. 2 presents a specific structural example that may be adopted in the matcher connected to the first high-frequency power source in the plasma processing apparatus shown in FIG. 1.

As shown in FIG. 2, the matcher 140 includes a first variable capacitor 162 branching out from the power supply line 160 of the first high-frequency power source 141 and a second variable capacitor 164 disposed further toward the downstream side relative to the branching point at the power supply line 160. The matcher equipped with these variable capacitors is thus able to fulfill the functions described above. A filter 165 which traps the high-frequency (e.g., 60 MHz) component originating from the first high-frequency power source 141 and the high-frequency (e.g., 2 MHz) component originating from a second high-frequency power source 151, to be detailed later, is disposed at the matcher 140 so as to ensure that the DC voltage current (hereafter may be simply referred to as a "DC voltage") from the variable DC power source 142 can be supplied to the upper electrode 120 efficiently. Namely, the DC voltage current from the variable DC power source 142 is connected to the power supply line 160 via a filter 165. This filter 165 may be constituted with a coil 166 and a capacitor 168, as shown in FIG. 2, so as to trap the high-frequency component from the first high-frequency power source 141 and the high-frequency component from the second high-frequency power source 151 to be detailed later via the coil and the capacitor. The DC voltage to be applied to the upper electrode may be set to a desirable level within a range of, for instance, −2000 through 10,000 V. The DC voltage may be applied by ensuring that the absolute value of the DC voltage is equal to or greater than 100 V and, more desirably, equal to or greater than 500 V.

The second high-frequency power source 151 is electrically connected to the susceptor 112 functioning as the lower electrode via a matcher 150, i.e., a second matcher. From the second high-frequency power source 151, high-frequency power with a frequency thereof set within the range of, for instance, 2 MHz~20 MHz, e.g., 2 MHz is output. As the high-frequency power from the second high-frequency power source 151 is applied to the susceptor 112, electrically charged particles present within the processing chamber 110 can be drawn toward the wafer W. The matcher 150, which matches the load impedance with the internal (or output) impedance of the second high-frequency power source 151, functions so as to match the internal impedance at the second high-frequency power source 151 with the load impedance in appearance as plasma is generated inside the processing chamber 110.

An exhaust pipe 102 communicating with an exhaust device (not shown) is connected at the bottom of the processing chamber 110. The exhaust device, which includes a vacuum pump such as a turbo-molecular pump, is capable of reducing the pressure inside the processing chamber 110 until a desired degree of vacuum is achieved. In addition, a wafer transfer part 104 through which the wafer W is carried in/out is formed at the sidewall of the processing chamber 110 and the transfer part 104 is opened/closed via a gate valve 106. When continuously etching a predetermined number of wafers (e.g., 25 wafers) in succession through lot processing, a first wafer W carried into the processing chamber 110 through the transfer part 104 on a transfer arm (not shown) undergoes an etching process. Once the etching process ends, the wafer W is carried out through the transfer port 104 and the next wafer W is carried into the processing chamber.

The plasma processing apparatus 100 includes the apparatus control unit 170, which controls the operations of various units such as the processing gas supply source 125, the first high-frequency power source 141 and the second high-frequency power source 151 as they are engaged in the etching process. The measurement results provided by the temperature sensor 131 are output to the apparatus control unit 170.

The plasma etching process is executed in the plasma processing apparatus 100 structured as described above, as the wafer W held on the transfer arm or the like (not shown) is carried into the processing chamber, placed on the susceptor 112 and held onto the susceptor 112, and the pressure inside the processing chamber 110 evacuated via the exhaust pipe 102 is lowered to a predetermined level. Then, the processing gas is supplied into the processing chamber 110 through the upper electrode 120 and the high-frequency power from the first high-frequency power source 141 is applied to the upper electrode 120, thereby generating plasma from the processing gas in the plasma generation space S within the processing chamber 110. In addition, as the high-frequency power from the second high-frequency power source 151 is applied to the susceptor 112, electrically charged particles in the plasma are guided toward the wafer W. By generating and manipulating the plasma as described above, the film present on the wafer W is etched. The wafer W having undergone the etching process is carried out of the processing chamber 110 on the transfer arm (not shown) or the like and the next wafer is carried into the processing chamber 110.

(Temperature Adjustment Device)

Next, in reference to FIG. 1, a temperature adjustment device 200, which operates as the electrode temperature adjustment device for adjusting the temperature of the upper electrode 120 in the plasma processing apparatus 100, is described. The temperature adjustment device 200 includes a circulating passage 210 through which brine circulates so as to pass through the upper electrode 120, a first heat exchanger 211 that executes heat exchange in the circulating passage 210 for the brine flowing out from the upper electrode 120 by using the sensible heat of water used as a liquid coolant, a second heat exchanger 212 that executes heat for the brine in the circulating passage 210 by using latent heat, an electric heater 213 that heats the brine and a tank 214 in which the brine to be supplied to the upper electrode 120 is stored. It is to be noted that the brine is a liquid heat exchanging medium with an insulating property, such as silicon oil, a fluorine-containing liquid or ethylene glycol.

The first heat exchanger 211, the second heat exchanger 212, the electric heater 213 and the tank 214 are connected in series at the circulating passage 210 and thus, the brine is allowed to circulate through the circulating passage by traveling through the upper electrode 120, the first heat exchanger 211, the second heat exchanger 212, the electric heater 213, the tank 214 and the upper electrode 120 in that order (see the circulation path E1 in FIG. 1).

A secondary coolant-side pipeline 220, through which a secondary coolant constituted of, for instance, water is delivered into the first heat exchanger 211 and is then discharged from the first heat exchanger, is connected to the first heat exchanger 211. This pipeline 220 is connected on its upstream side to a water supply device (not shown). As water flows through the pipeline 220, the brine in the circulating passage 210 is cooled at the first heat exchanger 211 with the sensible heat of water. A switching valve 221 is disposed at the pipeline 220. As the switching valve 221 is switched into an open state or a closed state, the brine cooling operation executed at the first heat exchanger 211 by using the water is turned ON/OFF.

The second heat exchanger 212, which is an evaporator, cools the brine in the circulating passage 210 with the latent heat of, for instance, an alternative Freon (e.g., hydro fluorocarbon (HFC)) used as a secondary coolant. A circulating circuit 230 constituting a freezer is connected to the second heat exchanger 212. A compressor 231, a condenser 232 and an expansion valve 233 are disposed in the circulating circuit 230. A supply pipeline 234, through which a tertiary coolant such as cooling water is supplied, is connected to the condenser 232. A flow regulating valve 235, for instance, may be disposed in the supply pipeline 234. As the quantity of cooling water supplied to the condenser 232 is adjusted via the flow regulating valve 235, the cooling performance of the second heat exchanger 212 is adjusted.

The brine in the circulating passage 210 can be heated by the electric heater 213 which generates heat on the power supplied from, for instance, a heater power source 240. A pump 250 is disposed at the tank 214 and the brine stored in the tank 214 can thus be force-fed toward the upper electrode 120.

In addition, a bypass passage 260, through which the brine force-fed from the tank 214 is guided so as to flow toward the first heat exchanger 211 by bypassing the upper electrode 120, is formed over the part of the circulating passage 210 extending between the tank 214 and the upper electrode 120. Through this bypass passage 260, the brine is allowed to circulate by traveling through the bypass passage 260, the first heat exchanger 211, the second heat exchanger 212, the electric heater 213, the tank 214 and the bypass passage 260 in that order (see the circulation path E2 in FIG. 1). A three-way valve 261 is disposed at the point at which the bypass passage 260 branches out from the circulating passage. Via this three-way valve 261, the circulation path E2, whereby the brine travels through the bypass passage 260 without traveling to the upper electrode 120 or the circulation path E1 whereby the brine travels through the upper electrode 120 can be selected.

The temperature adjustment device 200 includes a controller 270 that executes temperature adjustment for the upper electrode 120 by controlling the operations of the various units such as the switching valve 221 at the first heat exchanger 211, the flow regulating valve 235 at the second heat exchanger 212, the heater power source 240 at the electric heater 213, the pump 250 at the tank 214, the three-way valve 261 and the like. The controller 270, which is capable of carrying out communication with the apparatus control unit 170 of the plasma processing apparatus 100, controls the operations of the individual units based upon information originating from the apparatus control unit 170.

It is to be noted that the water used as the liquid coolant at the first heat exchanger 211 may be discarded once it circulates through the first heat exchanger once, or it may be recirculated with its temperature controlled to sustain a constant level. If the liquid coolant is recirculated with its temperature controlled at a constant level as described above, brine may be used at the first heat exchanger instead of water. In addition, instead of HFC, i.e., the alternative Freon, ammonia, air, carbon dioxide, a hydrocarbon gas or the like may be used as the coolant at the second heat exchanger 212.

(Operations of the Plasma Processing Apparatus)

In preparation for the etching process to be executed in the plasma processing apparatus 100 structured as described above, the gate valve 106 is first set in the open state, a wafer W to undergo the etching process is carried into the processing chamber 110 via the transfer port 104, and the wafer W is then placed on the susceptor 112 to be held fast thereto. The processing gas to be used in the etching process, originating from the processing gas supply source 125, is delivered to the upper electrode 120 at a predetermined flow rate and as the processing gas is supplied into the processing chamber 110 via the gas outlet holes 121a and the processing chamber 110 is evacuated via the exhaust device (not shown) through the exhaust pipe 102, the pressure inside the processing chamber 110 is lowered to a predetermined level. Various types of gases may be used as the processing gas. For instance, the processing gas may contain a halogen element, a typical example of which is a fluorocarbon gas ($C_xF_y$) such as $C_4F_8$ gas. In addition, the processing gas may contain another gas such as Ar gas or $O_2$ gas.

As the processing gas is delivered into the processing chamber 110 as described above, the first high-frequency power for plasma generation, originating from the first high-frequency power source 141, is applied to the upper electrode 120 at a predetermined power level and also the second high-frequency power for ion attraction, originating from the second high-frequency power source 151, is applied to the susceptor 112, i.e., the lower electrode, at a predetermined power level. In addition, a specific level of DC voltage, originating from the variable DC power source 142, is applied to the upper electrode 120.

The processing gas injected through the gas outlet holes 121a formed at the electrode plate 121 of the upper electrode 120 is raised to plasma while the glow discharge induced through the high-frequency power application in the space between the upper electrode 120 and the lower electrode, i.e., the susceptor 112, is in progress and the processing target surface of the wafer W is etched by radicals and ions formed in the plasma. Since the first high-frequency power used for the plasma generation is supplied to the upper electrode 120 and the second high-frequency power used to attract ions is supplied to the lower electrode, i.e., the susceptor 112, as described above, a large plasma control margin is assured.

By supplying high-frequency power in a high-frequency range (e.g., 10 MHz and higher) to the upper electrode 120 during the plasma formation, higher plasma density can be achieved in desirable conditions and high-density plasma can be formed at an even lower pressure.

In addition, a DC voltage with a specific polarity and that a specific level, originating from the variable DC power source 142, is applied to the upper electrode 120 during the plasma formation in the embodiment. By controlling the voltage applied from the variable DC power source 142, adhesion of a polymer onto the upper electrode 120 can be prevented and also, the plasma potential and the consistency in the plasma density at the plane of the wafer surface can be effectively controlled.

For instance, the voltage applied from the variable DC power source 142 can be controlled so as to achieve a deeper self-bias voltage $V_{dc}$ at the surface of the electrode plate 121 of the upper electrode 120, i.e., to achieve $V_{dc}$ with a greater absolute value at the surface of the upper electrode 120. In other words, even under conditions in which a polymer tends to collect readily on the upper electrode 120, e.g., when the level of the high-frequency power applied from the first high-frequency power source 140 is low, the surface of the upper electrode 120 can be kept clean with the polymer having settled onto the upper electrode 120 eliminated through sputtering by controlling the voltage applied from the variable DC power source 142 so as to sustain it at an optimal level. In such a case, since the optimal quantity of polymer can be supplied onto the wafer W, roughening of the surface of the photoresist film formed on the wafer W can be effectively prevented as well. It is to be noted that instead of controlling the voltage applied from the variable DC power source 142, an electrical current or power applied to the upper electrode may be controlled.

While the plasma etching process described above is underway, the temperatures of the upper electrode 120 and the susceptor 112 are individually adjusted to predetermined levels. The temperature of the susceptor 112 is adjusted with the coolant supplied into the coolant chamber 113 from the chiller unit (not shown). The temperature of the upper electrode 120, on the other hand, is adjusted by the temperature adjustment device 200 explained earlier. The upper electrode 120 is exposed in the plasma generation space S, generates a great quantity of heat as the high-frequency power output at a high output level for purposes of plasma generation is applied thereto and has a greater thermal capacity than the susceptor 112. In other words, it generates a greater quantity of heat than the susceptor 112 during the etching process and does not have as good a response to a temperature control medium as the susceptor 112. For these reasons, the temperature of the upper electrode 120 is adjusted independently of the temperature of the susceptor 112 in the embodiment.

When adjusting the temperature of the upper electrode 120 via the temperature adjustment device 200 as described above, the temperature of the heating medium, e.g., brine, must be set to a level lower than the temperature setting for the upper electrode 120 at the etching process start, since the temperature of the upper electrode 120 will start rising in response to the high-frequency power application at the etching process start and thus, the temperature of the upper electrode 120 must be held at the temperature setting by inhibiting the temperature increase. More specifically, the temperature of the brine should be adjusted to the target temperature at the etching process start by calculating in advance an optimal value for ΔT representing the temperature difference between the target temperature for the brine and the temperature setting for the upper electrode 120 prior to the etching process, so as to hold the temperature of the upper electrode 120 at the temperature setting from the very start of the etching process.

For instance, when processing a specific number of wafers W in succession through lot processing, ΔT should be calculated in advance and the brine target temperature should be set according prior to the lot processing start. Then the brine, the temperature of which is adjusted to the target temperature, should be supplied to the upper electrode 120 with the timing with which the high-frequency power is applied to the upper electrode 120 or immediately before applying the high-frequency power to the upper electrode 120 for the first wafer W to undergo the etching process. Through these measures, the temperature of the upper electrode 120 is held at the temperature setting by disallowing a temperature increase from the very beginning of the etching process, i.e., as the first wafer W undergoes the processing.

It is to be noted that during the actual wafer processing, the high-frequency power is repeatedly turned ON/OFF as each wafer W undergoes the processing (in each step if the processing is executed over a plurality of steps with the high-frequency power set at varying levels) and for this reason, a subtle change occurs in the temperature of the upper electrode 120. Accordingly, the brine temperature may be fine-adjusted during the wafer processing by monitoring the temperature of the upper electrode 120 via the temperature sensor 131 so as to adjust the temperature of the upper electrode 120 to the temperature setting based upon the temperature detected via the temperature sensor. In such a case, the temperature of the upper electrode 120 can be maintained at the temperature setting through the entire lot processing, from the first wafer W to the last wafer W.

(Temperature Difference ΔT)

The temperature difference ΔT between the brine target temperature and the temperature setting for the upper electrode 120 is now explained. As described earlier, the brine target temperature is set to a value lower than the temperature setting for the upper electrode 120 in order to inhibit a temperature increase at the upper electrode 120 due to the high-frequency power application and the like. This means that the temperature difference ΔT must be calculated by taking into consideration factors that may induce a temperature rise at the upper electrode 120. Such factors include, for instance, the first high-frequency power applied to the upper electrode 120, the second high-frequency power applied to the susceptor 112, the length of processing time per wafer W and the length of time over which the high-frequency power is applied during the processing time.

It has been learned based upon the results of tests and the like conducted by the inventor of the present invention et al. that in a plasma processing apparatus 100 such as the shown in FIG. 1, in which the DC voltage from the variable DC power source 142, superimposed upon the first high-frequency power, is also applied together with the first high-frequency power to the upper electrode 120, the DC voltage, too, constitutes a factor that induces a rise in the temperature at the upper electrode 120.

Figure 3:
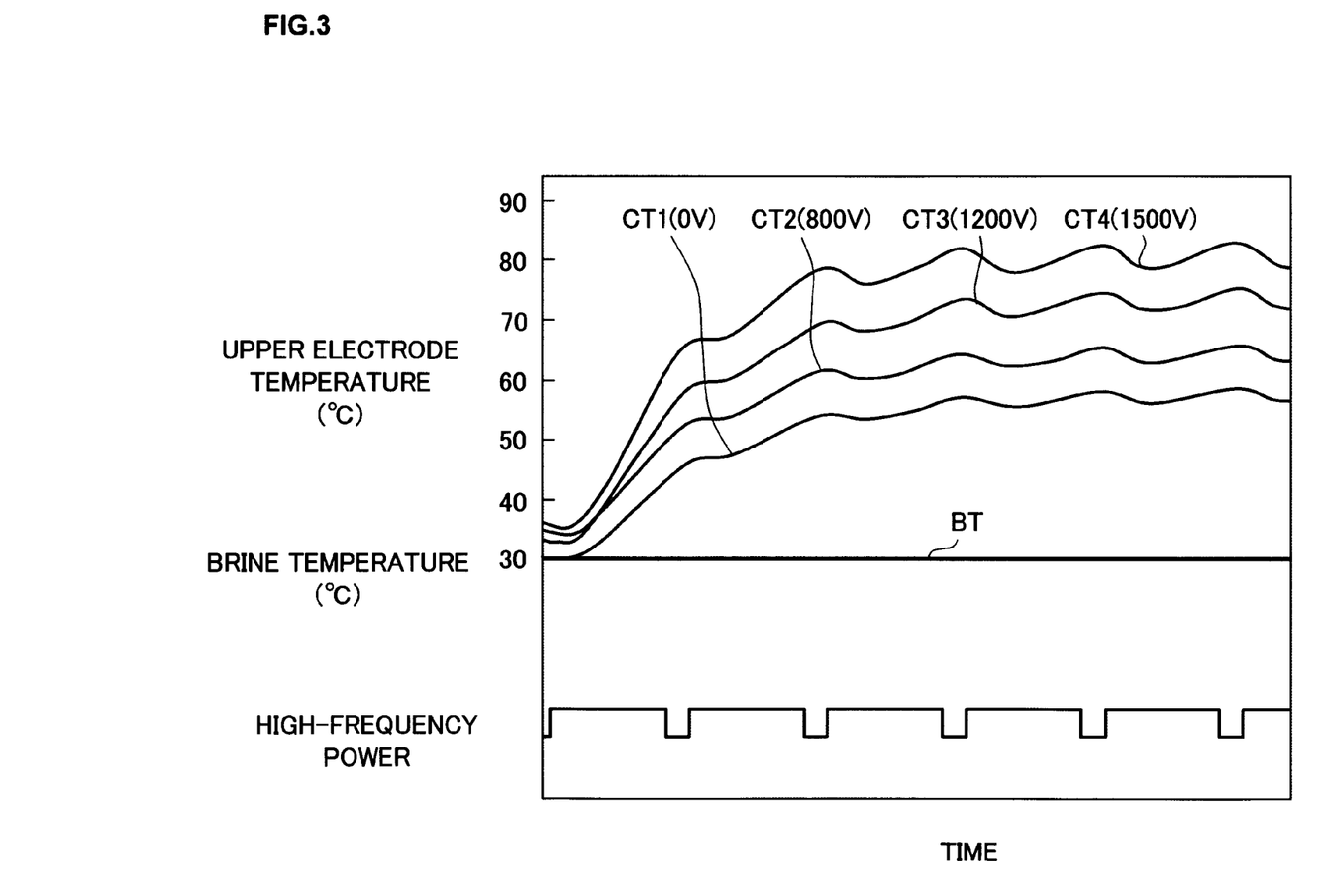
FIG. 3 shows how the temperature of the upper electrode may change as the level of the DC voltage superimposed upon the high-frequency power and applied together with the high-frequency power to the upper electrode is altered while sustaining the brine temperature at a constant level.

FIG. 3 presents the results of tests in which the temperature at the upper electrode 120 was detected by varying the level of the DC voltage from the variable DC power source 142, superimposed on the first high-frequency power and applied together with the first high-frequency power to the upper electrode 120. FIG. 3 presents a graph of the temperature of the upper electrode 120 detected via the temperature sensor 131 as the level of the DC voltage from the variable DC power source 142 was varied while the temperature BT of the brine was held at a constant level.

Temperature curves CT1, CT2, CT3 and CT4, each indicating the temperature of the upper electrode 120, in the graph in FIG. 3, respectively correspond to 0 V, 800 V, 1200 V and 1500 V set for the DC voltage from the variable DC power source 142. It is to be noted that the tests were conducted by selecting common settings for other processing conditions, e.g., the high-frequency power applied to the upper electrode 120 set at 2000 W, the high-frequency power applied to the susceptor 112 set to 4500 W and the processing chamber internal pressure set to 25 mTorr. In addition, the tests were conducted by using a processing gas constituted with a mixed gas containing standard gas constituents normally used to etch oxide films in combination, such a mixed gas may contain a CF gas (e.g., a $C_xF_y$ gas such as $C_4F_8$), a dilution gas (e.g., an inert gas such as Ar gas) and oxygen gas ($O_2$ gas).

FIG. 3 indicates that there is a clear difference between the temperatures of the upper electrode 120 detected by applying a DC voltage from the variable DC power source 142 to the upper electrode (CT2 through CT4) and the temperature detected without applying a DC voltage from the variable DC power source 142 (CT1). In addition, as the level of the DC voltage from the variable DC power source 142 increased, the temperature of the upper electrode 120, too, rose to a higher level. This means that the DC voltage from the variable DC power source 142 constitutes a factor that induces an increase in the temperature of the upper electrode 120.

The temperature of the upper electrode 120 may be caused to rise by the DC voltage applied to the upper electrode 120 for the following reason. Namely, electrons (negative) released from the upper electrode 120 are bounced off by the negative $V_{dc}$ on the wafer W and they are also bounced off at the surface of the electrode plate 121 of the upper electrode 120 due to the negative DC voltage from the variable DC power source 142. As a result, the electrons (negative) travel back and forth between the wafer W and the upper electrode 120 and, as the electrons stay in the plasma generation space S over a longer period of time compared to the period of time they would remain in the space with no DC voltage applied, a plasma density rises, which, in turn, increases the number of charged particles and increases the DC current traveling to the upper electrode 120, ultimately increasing the quantity of heat transferred into the upper electrode 120.

Figure 4:
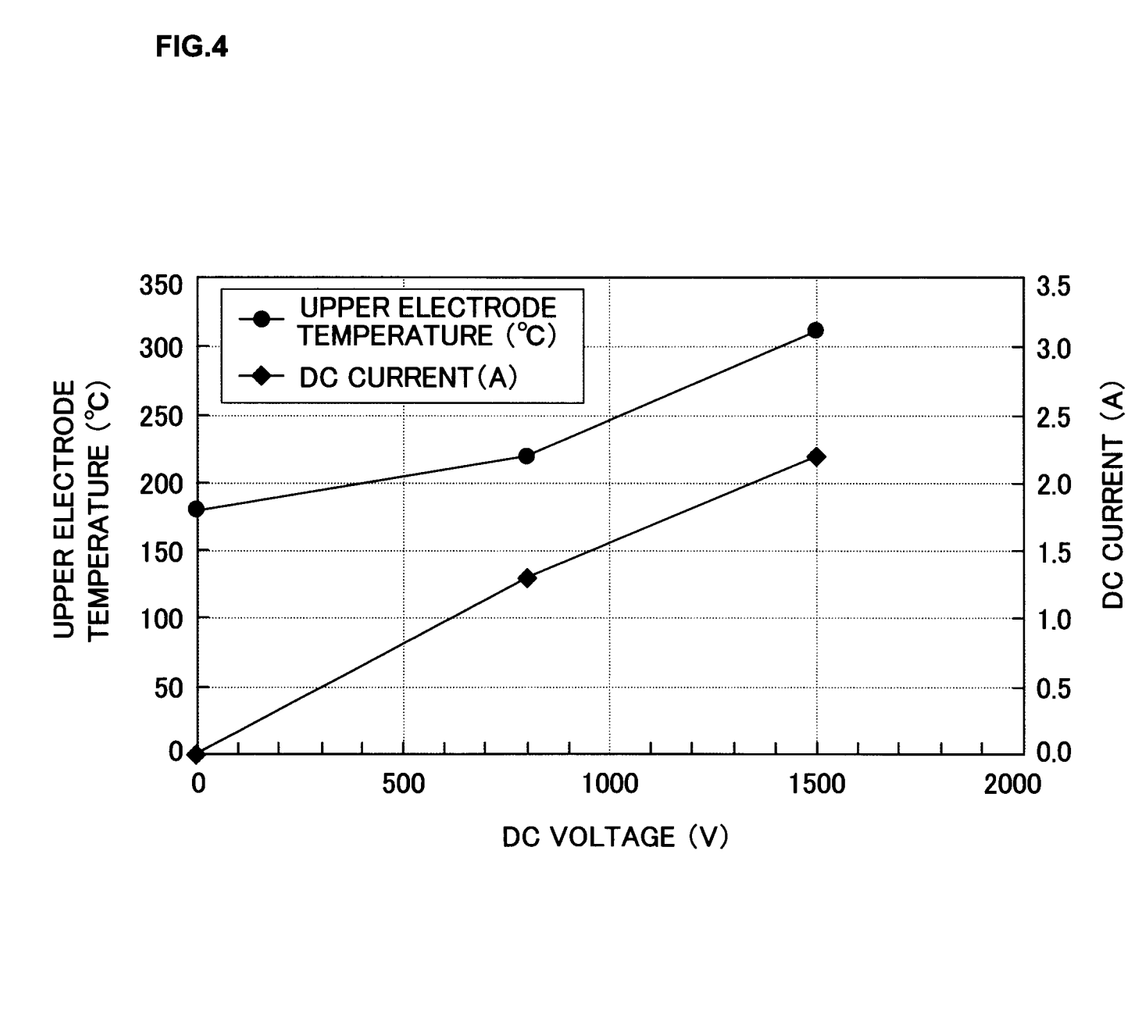
FIG. 4 shows a relationship between the DC current flowing to the upper electrode and the upper electrode temperature, which may be observed as the DC voltage is altered.

FIG. 4 shows the relationship between the DC current flowing to the upper electrode 120 and the temperature of the upper electrode 120, observed by varying the DC voltage from the variable DC power source 142. FIG. 4 presents graphs of the temperature at the upper electrode 120 and the DC current flowing to the upper electrode 120, obtained by plotting the temperature and the DC current detected with the DC voltage originating from the variable DC power source 142 set to 0 V, 800 V and 1500 V. It is to be noted that the tests were conducted at common settings selected as other processing conditions. More specifically, the high-frequency power applied to the upper electrode 120 was set to 1500 W, the high-frequency power applied to the susceptor 112 was set to 4500 W and the processing chamber internal pressure was set to 25 mTorr. In addition, the tests were conducted by using a processing gas constituted with a mixed gas containing standard gas constituents normally used to etch oxide films in combination. Such a mixed gas may contain a CF gas (e.g., a $C_xF_y$ gas such as $C_4F_8$), a dilution gas (e.g., an inert gas such as Ar gas) and oxygen gas ($O_2$ gas).

FIG. 4 indicates that as the DC voltage from the variable DC power source 142 increased, a greater DC current flowed to the upper electrode 120, raising the temperature of the upper electrode 120. In other words, the DC current flowing to the upper electrode 120 affects the temperature of the upper electrode 120.

Further tests conducted by the inventor of the present invention et al. revealed that the DC current flowing to the upper electrode 120 changes in correspondence to the level of the high-frequency power applied to the lower electrode, i.e., the susceptor 112.

Figure 5:
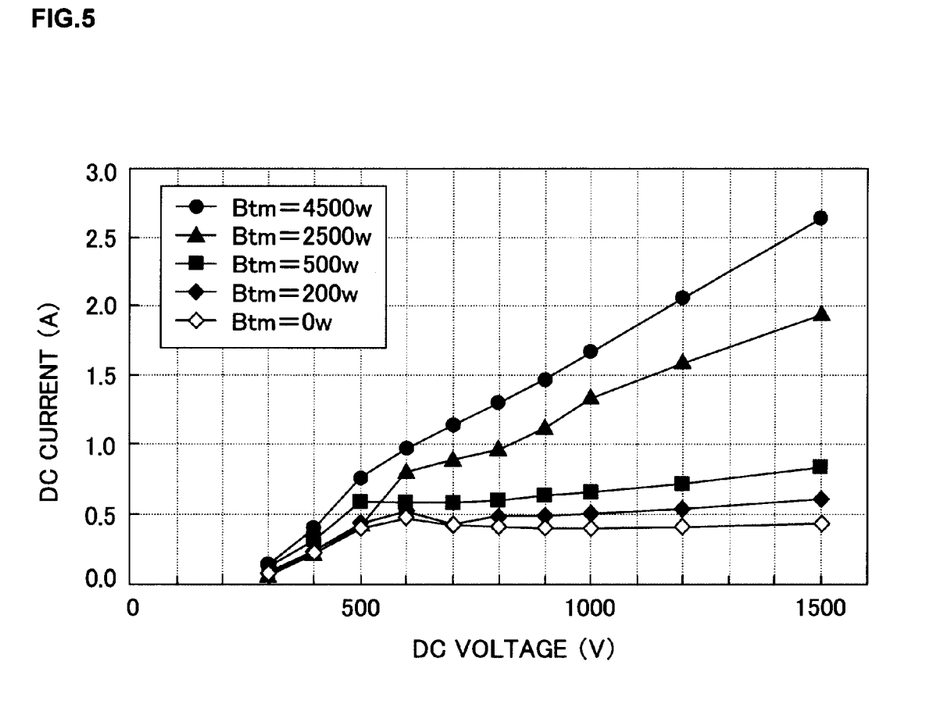
FIG. 5 shows the relationship between the DC current flowing to the upper electrode and the level of the high-frequency power applied to the susceptor functioning as the lower electrode.

FIG. 5 shows the relationship between the DC current flowing to the upper electrode 120 and the level of the high-frequency power applied to the susceptor 112. FIG. 5 presents a graph of the DC current flowing to the upper electrode 120, obtained by plotting the DC current detected as the DC voltage from the variable DC power source 142 was altered within a range of 300 V~1500 V, in correspondence to each of various settings, 0 W, 200 W, 500 W, 2500 W and 4500 W, selected for the level of the high-frequency power (Btm) applied to the susceptor 112. It is to be noted that the tests were conducted at common settings selected as other processing conditions. More specifically, the high-frequency power applied to the upper electrode 120 was set to 1800 W and the processing chamber internal pressure was set to 25 mTorr. In addition, the tests were conducted by using a processing gas constituted with a mixed gas containing standard gas constituents normally used to etch oxide films in combination. Such a mixed gas may contain a CF gas (e.g., a $C_xF_y$ and gas such as $C_4F_8$), a dilution gas (e.g., an inert gas such as Ar gas) and oxygen gas ($O_2$ gas), as in the tests the results of which are presented in FIG. 4.

FIG. 5 indicates that even when the DC voltage from the variable DC power source 142 remained at a constant level of, for instance, 1500 V, the DC current flowing to the upper electrode 120 increased as the level of the high-frequency power applied to the susceptor 112 increased from 0 W to 200 W, 500 W, 2500 W and 4500 W. In other words, even when the DC voltage originating from the variable DC power source 142 remains at a constant level, an increase in the level of the high-frequency power applied to the susceptor 112 increases the DC current flowing to the upper electrode 120, raising the temperature at the upper electrode 120 to a higher level.

The test results and the like discussed above allow us to draw the conclusion that when high-frequency power and a DC current are both applied to the upper electrode 120, the temperature difference ΔT between the brine target temperature and the upper electrode temperature setting, to be used to calculate the brine target temperature, should be calculated as expressed in arithmetic operation expression (1) below.

$$\Delta T = k(a \cdot A + b \cdot B + c \cdot HV \cdot B) \cdot D/C \quad (1)$$

k in expression (1) represents a conversion coefficient used when converting power to a temperature value. The term a·A inside the parentheses in expression (1) allows the effect of the high-frequency power applied to the upper electrode 120 to be factored in. More specifically, A represents the high-frequency power applied to the upper electrode 120 and a, which is a coefficient, indicates the extent to which the term representing the high-frequency power applied to the upper electrode 120 affects the temperature of the upper electrode 120.

The term b·B allows the effect of the high-frequency power applied to the susceptor 112 to be factored in. More specifically, B represents the high-frequency power applied to the susceptor 112 and b, which is a coefficient, indicates the extent to which the term representing the high-frequency power applied to the susceptor 112 affects the temperature of the upper electrode 120.

The term c·HV·B allows the effect of the DC voltage applied to the upper electrode 120 to be factored in. More specifically, HV represents the DC voltage originating from the variable DC power source 142 and applied to the upper electrode 120 and B represents the high-frequency power applied to the susceptor 112 as explained above. In the term, HV and B are multiplied by each other, since the temperature of the upper electrode 120 tends to rise to a greater extent as the level of the high-frequency power applied to the susceptor 112 increases even when the DC voltage from the variable DC power source 142 remains at a constant level, as shown in FIG. 5. Values selected in advance as etching process conditions may be used for HV and B. c, which is a coefficient, indicates the extent to which the term representing the DC voltage affects the temperature of the upper electrode 120.

It is to be noted that C in term D/C represents the length of processing time per wafer W and that D in the term D/C represents the length of time over which the high-frequency power is applied during the processing time C. It is also to be noted that the length of processing time C in this case is the length of time required to process a single wafer W, represented by the sum of the length of time over which the high-frequency power is applied and the length of time required to replace the current wafer W with a new wafer W. The temperature difference ΔT is calculated and the target temperature T is set by, for instance, the controller 270.

Preselected values set in advance as etching process conditions may be used for A, B, HV, C and D in the individual terms. In addition, optimal values may be selected for the various coefficients k, a, b and c in correspondence to the particulars of the actual etching process. Furthermore, the coefficients k, a, b and c may each be constituted with a plurality of coefficients. For instance, the coefficient c may be constituted with two coefficients with one of them held at a fixed value and the other used to adjust the level to be assumed for the coefficient c.

By incorporating the DC voltage term representing the DC voltage applied from the variable DC power source 142 into the arithmetic operation expression (expression 1) above used to calculate the temperature difference ΔT based upon which the brine target temperature is set as described above, the extent to which the DC voltage from the variable DC power source 142 contributes to the increase in the temperature of the upper electrode 120 can be minimized.

(Temperature Control for the Upper Electrode)

Next, the operation executed in the temperature adjustment device 200 to control the temperature of the upper electrode 120 is explained. An explanation is given on an example in which a specific number of wafers W undergo the etching process in succession through lot processing.

Before starting the lot processing on the wafers W (e.g., in an idling state), the brine temperature is pre-adjusted in the circulation path E1 within the circulating passage 210 and thus, the temperature at the upper electrode 120 is adjusted to a level matching the temperature setting H. More specifically, in the preliminary temperature adjustment executed before the lot processing starts, the results of temperature measurement, provided by the temperature sensor 131 by measuring the temperature of the upper electrode 120 shown in FIG. 1, are output to the apparatus control unit 170 and are then output to the controller 270 from the apparatus control unit 170. Based upon the temperature measurement results, the controller 270 adjust the flow regulating valve 235 at the second heat exchanger 212 and the heater power source 240 at the electric heater 213, so as to adjust the temperature of the brine in the circulating passage 210 to a level at which the temperature of the upper electrode 120 is set to the level matching the temperature setting H. At this time, the switching valve 221 at the first heat exchanger 211 is in a closed state and the brine temperature is adjusted via the second heat exchanger 212 and the electric heater 213. Namely, the brine is cooled by using the latent heat of the alternative Freon in the second heat exchanger 212. The temperature of the brine in the circulating passage 210 in the idling state is ultimately adjusted to a level slightly higher than the temperature setting H due to outgoing radiation and the like.

As the plasma processing apparatus 100 exits the idling state and the wafer lot processing starts, the target temperature T for the brine in the circulating passage 210 shown in FIG. 1 is set at the plasma processing apparatus 100. For instance, as processing start information provided by the apparatus control unit 170 is input to the controller 270, the target temperature T for the brine is set.

The target temperature T is lower than the temperature setting H for the upper electrode 120 and the temperature difference $\Delta T$ between the temperature setting H and the target temperature T is determined as expressed in (1) provided above. Once the temperature difference $\Delta T$ is calculated and the target temperature T is set, the switching valve 221 at first heat exchanger 211 is opened and the brine in the circulating passage 210 is rapidly cooled with the sensible heat of the water present in the first heat exchanger 211 and the latent heat of the alternative Freon in the second heat exchanger 212 until the brine temperature becomes stabilized at the target level T. Once the lot processing on the wafers W starts, the heat generated due to the high-frequency power for plasma generation applied to the upper electrode 120 is counterbalanced by the cooled brine, thereby inhibiting the temperature increase at the upper electrode 120.

Figure 6:
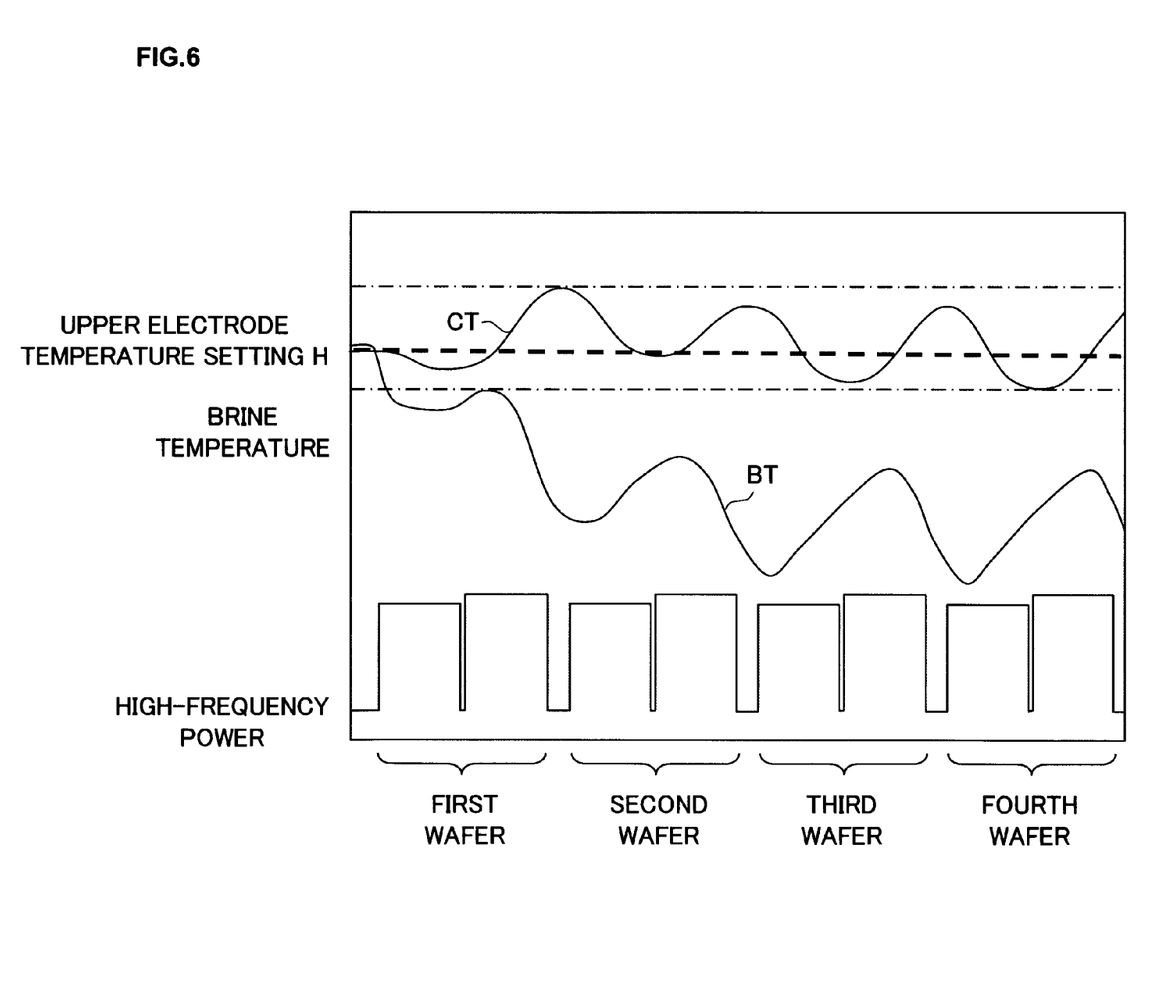
FIG. 6 presents the results of tests conducted by executing upper electrode temperature control based upon the temperature difference $\Delta T$ calculated without factoring in the DC voltage.
Figure 7:
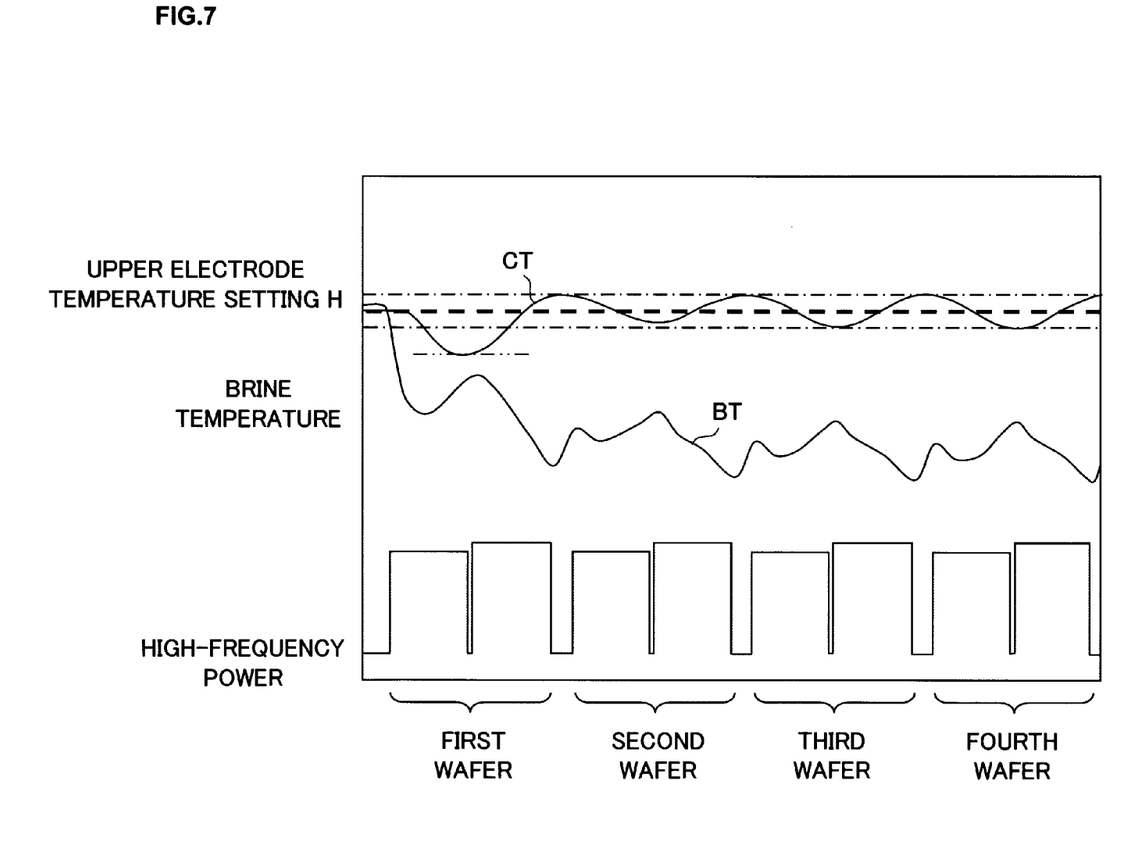

FIGS. 6 and 7 each present the results of a test conducted by controlling the temperature of the upper electrode 120 based upon $\Delta T$ calculated for lot processing of a predetermined number of wafers W as a DC voltage superimposed on the high-frequency power was applied together with the high-frequency power to the upper electrode 120. FIG. 6 presents the results of temperature control executed by calculating $\Delta T$ without factoring in the DC voltage, whereas FIG. 7 presents the results of temperature control executed by calculating $\Delta T$ with the DC voltage factored in. More specifically, FIG. 6 presents the results of a test conducted by calculating $\Delta T$ with the coefficient c set to 0 and thus the DC voltage term (c·HV·B) assuming value of 0 in expression (1), whereas FIG. 7 presents the results of a test conducted based upon $\Delta T$ calculated by substituting an optimal value for the DC voltage term (c·HV·B) in expression (1).

It is to be noted that FIGS. 6 and 7 each present the results of a test conducted by executing an etching process constituted with two steps (a first step and a second step executed in immediate succession following the first step) in which the high-frequency power was applied at different levels. In each test, the temperature CT of the upper electrode 120 was pre-adjusted to a level matching the temperature setting H (indicated by the dotted line in FIGS. 6 and 7) before starting the lot processing on the wafers W (e.g., in the idling state) as explained earlier, the brine target temperature was set based upon $\Delta T$ having been calculated and the first heat exchanger 211 and the second heat exchanger 212 started rapidly cooling the brine with the timing with which the high-frequency power was applied to the upper electrode 120 to process the first wafer W. Subsequently, the temperature CT of the upper electrode 120 was monitored via the temperature sensor 131 and the brine temperature BT was fine-adjusted so as to ensure that the temperature of the upper electrode 120 remained at the temperature setting H at all times.

It is to be noted that the tests, the results of which are presented in FIGS. 6 and 7, were conducted by setting the high-frequency power applied to the upper electrode 120 to 2000 W, the high-frequency power applied to the susceptor 112 to 1000 W, the DC voltage from the variable DC power source 142 to 700 V and the processing chamber internal pressure to 25 mTorr for the first step and setting the high-frequency power applied to the lower electrode 120 to 1000 W, the high-frequency power applied to the susceptor 112 to 3000 W, the DC voltage from the variable DC power source 142 to 1500 V and the processing chamber internal pressure to 25 mTorr for the second step. It is also to be noted that a processing gas constituted with a mixed gas (containing a CF gas, a diluting gas and oxygen gas) made up with standard gas constituent used to etch oxide films in combination was used in the first and second steps, as in the tests the results of which are presented in FIGS. 4 and 5.

Comparison of the test results presented in FIGS. 6 and 7 reveals that when $\Delta T$ was calculated by factoring in the DC voltage applied to the upper electrode 120, the maximum level assumed of the temperature CT at the upper electrode 120, indicated by the one-point chain line (the one-point chain line above the temperature setting H) remained closer to the temperature setting H, compared to the maximum level of the temperature CT at the upper electrode controlled based upon $\Delta T$ calculated without factoring in the DC voltage. In other words, the increase in the temperature CT of the upper electrode 120 was inhibited more effectively and the overall variance of the temperature CT at the upper electrode 120 was also reduced when the temperature was controlled based upon $\Delta T$ calculated by factoring in the DC voltage applied to the upper electrode.

In particular, while the variance of the temperature CT at the upper electrode 120, observed as the second and subsequent wafers W underwent the processing (the difference between the maximum level and the minimum level of the temperature CT at the upper electrode 120, detected as the second and subsequent wafers W were processed, and indicated by the one-point chain line) was approximately 20° C. in the test results presented in FIG. 6, the corresponding variance was much less significant at approximately 6° C. in the test results presented in FIG. 7, indicating a significant improvement in the accuracy of the temperature adjustment.

It is to be noted that as indicated by the two-point chain line in FIG. 7, the temperature CT of the upper electrode 120 tends to undershoot to a greater extent (becomes lowered to a greater extent) as the first wafer W undergoes the processing compared to the temperature CT of the upper electrode 120 monitored as the second and subsequent wafers W undergo the processing under control executed based upon $\Delta T$ calculated by factoring in the DC voltage applied to the upper electrode 120. This tendency for undershooting may be alleviated by adjusting the coefficient c in the DC voltage term (c·HV·B) in expression (1) used to calculate $\Delta T$ to a smaller value.

In addition, as the value B representing the level of the high-frequency power applied to the susceptor 112, i.e., the lower electrode, increases, the DC voltage term (c·HV·B) in expression (1) used to calculate $\Delta T$, too, increases and, as a result, the temperature CT of the upper electrode 120 tends to undershoot to a greater extent (tends to become lowered to a greater extent) as the first wafer W undergoes the processing compared to the temperature CT detected as the second and subsequent wafers W are processed. This undershoot, too, can be alleviated by adjusting the coefficient c in the DC voltage term (c·HV·B) in expression (1) used to calculate ΔT to a smaller value as in the case described above. Accordingly, the value assumed for the coefficient c in the DC voltage term (c·HV·B) may be adjusted in correspondence to the value B of the high-frequency power applied to the susceptor 112. Through these measures, the first wafer W can be processed with the temperature CT of the upper electrode 120 controlled with accuracy as high as that with which the temperature of the upper electrode is controlled while processing the second and subsequent wafers W.

As explained in detail above, the brine target temperature is set based upon ΔT calculated by factoring in the DC voltage superimposed upon the high-frequency power and applied together with the high-frequency power to the upper electrode 120, so as to minimize the extent to which the temperature of the upper electrode 120 is allowed to rise due to the DC voltage application. As a result, the temperature of the upper electrode 120 can be held steady with a higher level of accuracy through the entire lot processing, from the first wafer W to the last wafer W, which, in turn, eliminates inconsistency in the processing characteristics (e.g., the etching rate, the shape of elements formed on the wafers W) with which the wafers W in the lot are processed. Such inconsistency would otherwise manifest as the temperature of the upper electrode 120 were allowed to rise uncontrolled as the DC voltage was applied to the upper electrode 120.

It is to be noted that an expression similar to expression (1) may be used when high-frequency power alone is applied to the upper electrode 120 without applying any DC voltage to the upper electrode 120, as well as when a DC voltage superimposed upon high-frequency power is applied together with the high-frequency power to the upper electrode 120. Namely, while expression (1) includes the term (c·HV·B) in order to factor in the DC voltage applied to the upper electrode, expression (1) can be modified into an expression without the term (c·HV·B) by setting the value of the DC voltage HV to 0 if no DC voltage is applied to the upper electrode 120.

In addition, after the lot processing ends, the flow path through the bypass passage 260 may be opened via the three-way valve 261 so as to circulate the brine by bypassing the upper electrode 120 (circulation path E2). In this situation, the cooling operation by the first heat exchanger 211 and the cooling operation by the second heat exchanger 212 both stop and the brine becomes heated by the electric heater 213. Subsequently, the flow path through the upper electrode 120 is selected via the three-way valve 261 so as to allow the warm brine to circulate through the upper electrode 120 (circulation path E1). The three-way valve 261 is switched intermittently so as to alternately select the circulation path E1, whereby the brine passes through the upper electrode 120 and the shortcut circulation path E2, whereby the brine bypasses the upper electrode 120. As a result, the brine temperature is reset to the level in the idling state quickly and the temperature of the upper electrode 120, which temporarily becomes lower at the end of the wafer processing, can be restored to a level matching the temperature setting H within a short period of time.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention. For instance, the electrode temperature adjustment device may adopt any structure other than that shown in FIG. 1, as long as the temperature of the upper electrode is adjusted via a heating medium such as brine with the temperature thereof adjusted circulating through the upper electrode.

In addition, while an explanation is given above in reference to the embodiment on an example in which the temperature of the upper electrode in a plasma processing apparatus that executes etching processes is controlled, the present invention is not limited to this example and it may be adopted in temperature control for an upper electrode included in a plasma processing apparatus that executes plasma processing other than etching, such as film formation processing.

The present invention may be adopted in a plasma processing apparatus, an electrode temperature adjustment device and an electrode temperature adjustment method.

What is claimed is:

1. A plasma processing apparatus, comprising:
   an evacuatable processing chamber in which a processing target substrate is placed;
   a first electrode disposed inside said processing chamber;
   a second electrode disposed to face opposite said first electrode and supports the substrate;
   a first high-frequency power source that applies first high-frequency power to said first electrode;
   a second high-frequency power source that applies second high-frequency power with a frequency lower than the first high-frequency power to said second electrode;
   a DC power source that applies a DC voltage to said first electrode;
   a processing gas supply means for supplying a specific processing gas into said processing chamber;
   a temperature adjustment device that adjusts the temperature of said first electrode by circulating a heating medium with the temperature thereof adjusted to a predetermined level through a circulating passage formed in said first electrode; and
   a control unit that executes control for temperature adjustment for said heating medium when processing the substrate based upon a heating medium target temperature to be achieved by said heating medium to adjust the temperature of said first electrode to a predetermined temperature setting, calculated based upon, at least, the high-frequency power to be applied to the individual electrodes and the DC voltage to be applied to said first electrode, wherein:
   said control unit is configured to calculate the heating medium target temperature based upon a predetermined arithmetic operation expression for determining a temperature difference between said predetermined temperature setting for said first electrode and said heating medium target temperature;
   said predetermined arithmetic operation expression in the control unit includes a first high-frequency power-based term, a second high-frequency power-based term and a DC voltage-based term; and
   said DC voltage-based term is constituted with a multiplicative term in which the DC voltage and the second high-frequency power are multiplied by each other to form a product HV×B, where B is the second high-frequency power applied to the second electrode to which the DC voltage is not applied and HV is the DC voltage which is equal to or higher than 500 V and is applied to the first electrode.

2. A plasma processing apparatus according to claim 1, wherein:
   with ΔT representing said temperature difference between said predetermined temperature setting for said first electrode and said heating medium target temperature, said arithmetic operation expression is written as;

$$\Delta T = k(a \times A + b \times B + c + HV \times B) \cdot D/C$$

(k: a power-to-temperature conversion coefficient, A: the first high-frequency power, B: the second high-frequency power, HV: the DC voltage, C: the length of processing time per substrate, D: the length of time over which the high-frequency power is applied during the processing time C, a: a coefficient for term A, b: a coefficient for term B, c: a coefficient for term HV×B).

3. A plasma processing apparatus according to claim 2, wherein:
said coefficient c in said arithmetic operation expression is adjusted to an optimal value in correspondence to the level of the second high-frequency power.

4. A plasma processing apparatus according to claim 1, wherein:
said temperature adjustment device includes;
a circulating passage passing through said first electrode, through which said heating medium is circulated at said first electrode;
a first heat exchanger that executes heat exchange for said heating medium having passed through said electrode by using the sensible heat of a liquid coolant in said circulating passage;
a second heat exchanger that executes heat exchange for said heating medium having passed through said first heat exchanger by using the latent heat of a coolant in said circulating passage; and
a heater that heats said heating medium, which is to be supplied into said electrode, in said circulating passage.

5. A plasma processing apparatus according to claim 1, wherein:
said first electrode is an upper electrode and said second electrode is a lower electrode.

6. An electrode temperature adjustment device that adjusts the temperature of a first electrode in a plasma processing apparatus that includes said first electrode and a second electrode disposed inside a processing chamber so as to face opposite each other and executes a specific type of processing on a substrate placed on said second electrode by applying first high-frequency power and a DC voltage to said first electrode and applying second high-frequency power with a frequency lower than the first high-frequency power to said second electrode, comprising:
a circulating passage passing through said first electrode through which a heating medium is circulated at said first electrode;
a heating medium temperature adjuster that adjusts the temperature of said heating medium; and
a control unit that executes control for temperature adjustment for said heating medium when processing the substrate based upon a heating medium target temperature to be achieved by said heating medium to adjust the temperature of said first electrode to a predetermined temperature setting, calculated based upon, at least, the high-frequency power to be applied to the individual electrodes and the DC voltage to be applied to said first electrode, wherein:
said control unit is configured to calculate the heating medium target temperature based upon a predetermined arithmetic operation expression for determining a temperature difference between said predetermined temperature setting for said first electrode and said heating medium target temperature;

said predetermined arithmetic operation expression in the control unit includes a first high-frequency power-based term, a second high-frequency power-based term and a DC voltage-based term; and
said DC voltage-based term is constituted with a multiplicative term in which the DC voltage and the second high-frequency power are multiplied by each other to form a product HV×B, where B is the second high-frequency power applied to the second electrode to which the DC voltage is not applied and HV is the DC voltage which is equal to or higher than 500 V and is applied to the first electrode.

7. An electrode temperature adjustment device according to claim 6, wherein:
with ΔT representing said temperature difference between said predetermined temperature setting for said first electrode and said heating medium target temperature, said arithmetic operation expression is written as;

$$\Delta T = k(a \times A + b \times B + c + HV \times B) \cdot D/C$$

(k: a power-to-temperature conversion coefficient, A: the first high-frequency power, B: the second high-frequency power, HV: the DC voltage, C: the length of processing time per substrate, D: the length of time over which the high-frequency power is applied during the processing time C, a: a coefficient for term A, b: a coefficient for term B, c: a coefficient for term HV×B).

8. An electrode temperature adjustment method for adjusting the temperature of a first electrode in a plasma processing apparatus that includes said first electrode and a second electrode disposed inside a processing chamber so as to face opposite each other and executes a specific type of processing on a substrate placed on said second electrode by applying first high-frequency power and a DC voltage to said first electrode and applying second high-frequency power with a frequency lower than the first high-frequency power to said second electrode, comprising:
a step executed before processing the substrate, in which a heating medium target temperature that must be achieved by a heating medium to adjust the temperature of said first electrode to a predetermined temperature setting is calculated based upon, at least, the high-frequency power to be applied to the individual electrodes and the DC voltage to be applied to said first electrode; and
a step executed when processing the substrate, in which control is executed to hold the temperature of said first electrode at the predetermined temperature setting by circulating said heating medium the temperature of which is adjusted based upon the heating medium target temperature through a circulating passage formed inside said first electrode, wherein:
said heating medium target temperature is calculated based upon a predetermined arithmetic operation expression for determining a temperature difference between said predetermined temperature setting for said first electrode and said heating medium target temperature;
said predetermined arithmetic operation expression includes a first high-frequency power-based term, a second high-frequency power-based term and a DC voltage-based term; and
said DC voltage-based term is constituted with a multiplicative term in which the DC voltage and the second high-frequency power are multiplied by each other to form a product HV×B, where B is the second high-frequency power applied to the second electrode to which the DC voltage is not applied and HV is the DC voltage which is equal to or higher than 500 V and is applied to the first electrode.

9. An electrode temperature adjustment method according to claim 8, wherein:
with ΔT representing said temperature difference between said predetermined temperature setting for said first electrode and said heating medium target temperature, said arithmetic operation expression may be written as;

$$\Delta T = k(a \times A + b \times B + c + HV \times B) \cdot D/C$$

(k: a power-to-temperature conversion coefficient, A: the first high-frequency power, B: the second high-frequency power, HV: the DC voltage, C: the length of processing time per substrate, D: the length of time over which the high-frequency power is applied during the processing time C, a: a coefficient for term A, b: a coefficient for term B, c: a coefficient for term HV×B).

10. An electrode temperature adjustment method according to claim 9, wherein:
in said step of calculating said heating medium target temperature, said heating medium target temperature is determined based upon ΔT calculated as expressed in said arithmetic operation expression by reading out the first high-frequency power, the second high-frequency power, the DC voltage, the length of processing time per substrate, the length of time over which the high-frequency power is applied during the processing time and the coefficients for the individual terms, all stored in advance as processing conditions in a storage medium.

11. A plasma processing apparatus, comprising:
an evacuatable processing chamber in which a processing target substrate is placed;
a first electrode disposed inside said processing chamber;
a second electrode disposed to face opposite said first electrode and supports the substrate;
a first high-frequency power source that applies first high-frequency power to said first electrode;
a second high-frequency power source that applies second high-frequency power with a frequency lower than the first high-frequency power to said second electrode;
a DC power source that applies a DC voltage to said first electrode;
a processing gas supply means for supplying a specific processing gas into said processing chamber;
a temperature adjustment device that adjusts the temperature of said first electrode by circulating a heating medium with the temperature thereof adjusted to a predetermined level through a circulating passage formed in said first electrode; and
a control unit that executes control for temperature adjustment for said heating medium when processing the substrate based upon a heating medium target temperature to be achieved by said heating medium to adjust the temperature of said first electrode to a predetermined temperature setting, wherein:
the control unit is configured to calculate the heating medium target temperature based on a magnitude of the DC voltage applied to the first electrode and a magnitude of the second high-frequency power applied to the second electrode in which the DC voltage and the second high-frequency power are multiplied by each other to form a product HV×B, where B is the second high-frequency power applied to the second electrode to which the DC voltage is not applied and HV is the DC voltage which is equal to or higher than 500 V and is applied to the first electrode.

* * * * *